(12) United States Patent
Jung et al.

(10) Patent No.: US 11,288,192 B2
(45) Date of Patent: Mar. 29, 2022

(54) MEMORY CONTROLLING DEVICE AND MEMORY SYSTEM INCLUDING THE SAME

(71) Applicants: MemRay Corporation, Seoul (KR); YONSEI UNIVERSITY, UNIVERSITY—INDUSTRY FOUNDATION (UIF), Seoul (KR)

(72) Inventors: Myoungsoo Jung, Incheon (KR); Gyuyoung Park, Incheon (KR); Miryeong Kwon, Incheon (KR)

(73) Assignees: MemRay Corporation, Seoul (KR); Yonsei University, University—Industry Foundation (UIF), Seoul (KR)

( * ) Notice: Subject to any disclaimer, the term of this patent is extended or adjusted under 35 U.S.C. 154(b) by 0 days.

(21) Appl. No.: 16/860,801

(22) Filed: Apr. 28, 2020

(65) Prior Publication Data
US 2020/0257624 A1 Aug. 13, 2020

Related U.S. Application Data

(63) Continuation of application No. 16/250,343, filed on Jan. 17, 2019, now Pat. No. 10,664,394.

(30) Foreign Application Priority Data

Apr. 11, 2018 (KR) .................. 10-2018-0042372
Jun. 12, 2018 (KR) .................. 10-2018-0067739

(51) Int. Cl.
*G06F 12/08* (2016.01)
*G11C 14/00* (2006.01)
(Continued)

(52) U.S. Cl.
CPC ...... *G06F 12/0804* (2013.01); *G06F 12/0895* (2013.01); *G11C 14/0045* (2013.01);
(Continued)

(58) Field of Classification Search
CPC ............. G06F 12/0804; G06F 12/0895; G06F 2212/1021; G06F 2212/608; G06F 13/1694; G11C 14/0045; G11C 13/0069
See application file for complete search history.

(56) References Cited

U.S. PATENT DOCUMENTS

| | | | | |
|---|---|---|---|---|
| 6,240,040 B1 ‡ | 5/2001 | Akaogi | ................. | G11C 16/08 365/18 |
| 8,130,541 B2 ‡ | 3/2012 | Kim | ................. | G11C 29/12005 365/14 |

(Continued)

FOREIGN PATENT DOCUMENTS

| | | |
|---|---|---|
| JP | 2012-523624 | ‡ 10/2012 |
| KR | 10-2005-0080851 | ‡ 8/2005 |

(Continued)

OTHER PUBLICATIONS

Nalli, S., Haria, S., Hill, M. D., Swift, M. M., Volos, H., and Keeton, K. An analysis of persistent memory use with whisper. In Proceedings of the Twenty-Second International Conference on Architectural Support for Programming Languages and Operating Systems (2017), ACM.‡

(Continued)

*Primary Examiner* — Masud K Khan
(74) *Attorney, Agent, or Firm* — Kevin S. MacKenzie

(57) ABSTRACT

A memory controlling device configured to connect to a memory module including a resistance switching memory cell array which is partitioned into a plurality of partitions including a first partition and a second partition is provided. A first controlling module accesses the memory module. A second controlling module determines whether there is a conflict for the first partition to which a read request targets when an incoming request is the read request, instructs the first controlling module to read target data of the read request from the memory module when a write to the second (Continued)

partition is in progress, and suspends the read request when a write to the first partition is in progress.

14 Claims, 14 Drawing Sheets

(51) Int. Cl.
    *G06F 13/16* (2006.01)
    *G11C 13/00* (2006.01)
    *G06F 12/0804* (2016.01)
    *G06F 12/0895* (2016.01)
(52) U.S. Cl.
    CPC .. *G06F 13/1694* (2013.01); *G06F 2212/1021* (2013.01); *G06F 2212/608* (2013.01); *G11C 13/0069* (2013.01)

(56) References Cited

U.S. PATENT DOCUMENTS

| | | | | |
|---|---|---|---|---|
| 8,266,367 | B2 ‡ | 9/2012 | Yu | G06F 3/0608 711/10 |
| 10,048,886 | B2 ‡ | 8/2018 | Guddekoppa | G06F 3/0643 |
| 2011/0307663 | A1* | 12/2011 | Kultursay | G06F 30/30 711/125 |
| 2012/0173809 | A1* | 7/2012 | Ko | G06F 12/0893 711/105 |
| 2015/0378780 | A1* | 12/2015 | Busaba | G06F 9/30047 711/137 |
| 2017/0300417 | A1* | 10/2017 | Xin | G06F 12/0875 |
| 2017/0357600 | A1‡ | 12/2017 | Moon | G06F 12/0891 |
| 2018/0032445 | A1‡ | 2/2018 | Lee | G06F 3/0659 |
| 2018/0203798 | A1* | 7/2018 | Hughes | G06F 12/0888 |

FOREIGN PATENT DOCUMENTS

| | | | |
|---|---|---|---|
| KR | 10-2014-0135580 | ‡ | 11/2014 |
| KR | 10-2017-0138765 | ‡ | 12/2017 |
| KR | 10-2018-0012565 | ‡ | 2/2018 |
| WO | WO-2010-144832 | ‡ | 12/2010 |

OTHER PUBLICATIONS

Ovshinsky, S. R. Reversible electrical switching phenomena in disordered structures. Physical Review Letters 21, 20 (1968), 1450.‡
Park, H., Yoo, S., and Lee, S. Power management of hybrid dram/pram-based main memory. In Design Automation Conference (DAC), 2011 48th ACM/EDAC/IEEE (2011), IEEE.‡
Park, S.-H., Park, J.-W., Kim, S.-D., and Weems, C. C. A pattern adaptive nand flash memory storage structure. IEEE transactions on computers 61, 1 (2012), 134-138.‡
Park, S.-Y., Seo, E., Shin, J.-Y., Maeng, S., and Lee, J. Exploiting internal parallelism of flash-based ssds. IEEE Computer Architecture Letters 9, 1 (2010), 9-12.‡
Qureshi, M. K., Franceschini, M. M., Jagmohan, A., and Lastras, L. A. Preset: improving performance of phase change memories by exploiting asymmetry in write times. ACM SIGARCH Computer Architecture News 40, 3 (2012).‡
Linn, E., Rosezin, R., Kugeler, C., and Waser, R. Complementary resistive switches for passive nanocrossbar memories. Nature materials 9, 5 (2010), 403.‡
Liu, S., Kolli, A., Ren, J., and Khan, S. Crash consistency in encrypted non-volatile main memory systems.‡
Minh, C. C. Designing an effective hybrid transactional memory system. Stanford University, 2008.‡
Laforest, C. E., and Steffan, J. G. Efficient multiported memories for fpgas. In Proceedings of the 18th annual ACM/SIGDA international symposium on Field programmable gate arrays (2010), ACM.‡
Lee, B. C., Ipek, E., Mutlu, O., and Burger, D. Architecting phase change memory as a scalable dram alternative. In International Symposium on Computer Architecture (ISCA) (2009).‡
Volos, H., Tack, A. J., and Swift, M. M. Mnemosyne: Lightweight persistent memory. In ACM SIGARCH Computer Architecture News (2011), vol. 39, ACM.‡
Xilinx. 7 series fpgas data sheet. https://www.xilinx.com/support/documentation/data_sheets/ds180_7Series_Overview.pdf, 2018.‡
Yang, B.-D., Lee, J.-E., Kim, J.-S., Cho, J., Lee, S.-Y., and Yu, B.-G. A low power phase-change random access memory using a data-comparison write scheme. In Circuits and Systems, 2007. ISCAS 2007. IEEE International Symposium on (2007), IEEE.‡
Yi, J., Ha, Y., Park, J., Kuh, B., Horii, H., Kim, Y., Park, S., Hwang, Y., Lee, S., and Ahn, S. Novel cell structure of pram with thin metal layer inserted gesbte. In Electron Devices Meeting, 2003. IEDM'03 Technical Digest. IEEE International (2003), IEEE.‡
Yue, J., and Zhu, Y. Accelerating write by exploiting pcm asymmetries. In High Performance Computer Architecture (HPCA2013), 2013 IEEE 19th International Symposium on (2013), IEEE.‡
Zhou, P., Zhao, B., Yang, J., and Zhang, Y. A durable and energy efficient main memory using phase change memory technology. In International Symposium on Computer Architecture (ISCA) (2009).‡
Intel Corporation. Persistent memory programming. http://pmem.io.‡
Intel Corporation. Intel optane technology. https://www.intel.com/content/www/us/en/architecture-and-technology/intel-optane-technology.html, 2016.‡
Sainio, A. Nvdimm—changes are here so what's next? In-Memory Computing Summit (2016).‡
Jung, M. Exploring parallel data access methods in emerging non-volatile memory systems. IEEE Transactions on Parallel and Distributed Systems 28, 3 (2017), 746-759.‡
Strukov, D. B., Snider, G. S., Stewart, D. R., and Williams, R. S. The missing memristor found. nature 453, 7191 (2008), 80.‡
Sun, G., Niu, D., Ouyang, J., and Xie, Y. A frequent-value based pram memory architecture. In Proceedings of the 16th Asia and South Pacific Design Automation Conference (2011), IEEE Press.‡
Qureshi, M. K., Srinivasan, V., and Rivers, J. A. Scalable high performance main memory system using phase-change memory technology. In International Symposium on Computer Architecture (ISCA) (2009).‡
Chang, J., and Sainio, A. Nvdimm-n cookbook: A soup-tonuts primer on using nvdimm-ns to improve your storage performance, 2015.‡
Redaelli, A., Pirovano, A., Pellizzer, F., Lacaita, A., Ielmini, D., and Bez, R. Electronic switching effect and phase-change transition in chalcogenide materials. IEEE Electron Device Letters 25, 10 (2004), 684-686.‡
Grupp, L. M., Davis, J. D., and Swanson, S. The hareytortoise: Managing heterogeneous write performance in ssds. In USENIX Annual Technical Conference (2013).‡
Ielmini, D., Lavi77ari, S., Sharma, D., and Lacaita, A. L. Physical interpretation, modeling and impact on phase change memory (pcm) reliability of resistance drift due to chalco-genide structural relaxation. In Electron Devices Meeting, 2007. IEDM 2007. IEEE International (2007), IEEE.‡
Arulraj, J., Pavlo, A., and Dulloor, S. R. Let's talk about storage & recovery methods for non-volatile memory database systems. In Proceedings of the 2015 ACM SIGMOD International Conference on Management of Data (2015), ACM.‡
Bae, Y.-C., Park, J.-Y., Rhee, S. J., Ko, S. B., Jeong, Y., Noh, K.-S., Son, Y., Youn, J., Chu, Y., Cho, H., et al. A 1.2 v 30nm 1.6 gb/s/pin 4gb lpddr3 sdram with input skew calibration and enhanced control scheme. In Solid-State Circuits Conference Digest of Technical Papers (ISSCC), 2012 IEEE International (2012), IEEE.‡
Bailey, K. A., Hornyack, P., Ceze, L., Gribble, S. D., and Levy, H. M. Exploring storage class memory with key value stores. In Proceedings of the 1st Workshop on Interactions of NVM/FLASH with Operating Systems and Workloads (2013), ACM, p. 4.‡
Kang, M., Park, T., Kwon, Y., Ahn, D., Kang, Y., Jeong, H., Ahn, S., Song, Y., Kim, B., Nam, S., et al. Pran cell technology and characterization in 20nm node size. In Electron Devices Meeting (IEDM), 2011 IEEE International (2011), IEEE.‡
Crit-bit tree. cr.yp.to/critbit.html.‡
Kang, S., Cho, W. Y., Cho, B.-H., Lee, K.-J., Lee, C.-S., Oh, H.-R., Choi, B.-G., Wang, Q., Kim, H.-J., Park, M.-H., et al. A 0.1um 1.8-v

(56) References Cited

OTHER PUBLICATIONS 256-mb phase-change random access memory (pram) with 66-mhz synchronous burst-read operation. IEEE Journal of Solid-State Circuits 42, 1 (2007), 210-218.‡

Kim, K.-H., Gaba, S., Wheeler, D., Cruz-Albrecht, J. M., Hussain, T., Srinivasa, N., and Lu, W. A functional hybrid memristor crossbar-array/cmos system for data storage and neuromorphic applications. Nano letters 12,1 (2011), 389-395.‡

Akel, A., Caulfield, A. M., Mollov, T. I., Gupta, R. K., and Swanson, S. Onyx: A prototype phase change memory storage array. HotStorage 1 (2011), 1.‡

Jung, M. Nearzero: An integration of phase change memory with multi-core coprocessor. IEEE Computer Architecture Letters 16, 2 (2017), 136-140. https://www.intel.com/content/www/us/en/architecture-and-technology/intel-optane-technology.html.‡

Chen, F., Lee, R., and Zhang, X. Essential roles of exploiting internal parallelism of flash memory based solid state drives in high-speed data processing. In High Performance Computer Architecture (HPCA), 2011 IEEE 17th International Symposium on (2011), IEEE.‡

Cho, S., and Lee, H. Flip-n-write: a simple deterministic technique to improve pram write performance, energy and endurance. In Proceedings of the 42nd Annual IEEE/ACM International Symposium on Microarchitecture (2009), ACM.‡

Jung, M., and Kandemir, M. T. An evaluation of different page allocation strategies on high-speed ssds. In HotStorage (2012).‡

Chen, Y., Zhao, J., and Xie, Y. 3d-nonfar: Three-dimensional non-volatile fpga architecture using phase change memory. In Low-Power Electronics and Design (ISLPED), 2010 ACM/IEEE International Symposium on (2010), IEEE.‡

Coburn, J., Caulfield, A. M. Akel, A., Grupp, L. M., Gupta, R. K., Jhala, R., and Swanson, S. Nv-heaps: making persistent objects fast and safe with next-generation, non-volatile memories. ACM Sigplan Notices 46, 3 (2011), 105-118.‡

Jung, M., Shalf, J., and Kandemir, M. Design of a large-scale storage-class rram system. In Proceedings of the 27th international ACM conference on International conference on super-computing (2013), ACM.‡

Cooperation, I. Intel architecture instruction set extensions programming reference. Intel Corp., Mountain View, CA, USA, Tech. Rep (2016), 319433-030.‡

"Phase Change Memory Device Physics, Reliability and Applications" Chapter 10 "PCM Array Architecture and Management" (Corrado Villa, Springer International Publishing, 2018 pp. 285-311).

\* cited by examiner
‡ imported from a related application

MEMORY CONTROLLING DEVICE AND MEMORY SYSTEM INCLUDING THE SAME

CROSS-REFERENCE TO RELATED APPLICATION

This application is a continuation of U.S. patent application Ser. No. 16/250,343, filed on Jan. 17, 2019, which claims priority to and the benefit of Korean Patent Application Nos. 10-2018-0042372 filed on Apr. 11, 2018 and 10-2018-0067739 filed on Jun. 12, 2018, the entire contents of which are incorporated herein by reference.

BACKGROUND

(a) Field

The described technology generally relates to a memory controlling device and a memory system including the same.

(b) Description of the Related Art

Persistent memory systems, such as NVDIMM (non-volatile dual in-line memory module) and Optane DIMM (Optane dual in-line memory module) proposed by Intel®, can offer data consistency even when there is an unexpected power loss or system crash.

The persistent memory system may employ a resistance switching memory such as a phase-change RAM (phase-change random access memory, PRAM) or a resistive RAM (RRAM). Since a write latency is longer than a read latency in the resistance switching memory, a method for hiding the long write latency from a host thereby improving a system performance is required. Further, a design of a memory controlling device for hiding the write latency from the host is required.

SUMMARY

An embodiment of the present invention provides a memory controlling device and a memory system using a resistance switching memory.

According to an embodiment of the present invention, a memory controlling device configured to connect to a first memory module and a second memory module used as a cache is provided. The first memory module includes a resistance switching memory cell array which is partitioned into a plurality of partitions including a first partition and a second partition. The memory controlling device includes a memory controller that accesses the first memory module and the second memory module, a lookup logic that manages tag information of a plurality of cache lines of the second memory module, the plurality of cache lines corresponding to a plurality of cache indices, respectively, and a cache controller. The cache controller splits an address of a read request into at least a first cache index and a first tag, determines whether the read request is a cache hit or a cache miss by referring to the lookup logic based on the first cache index and the first tag, and instructs the memory controller to read target data of the read request from the first memory module when the read request targets to the second partition in a case where the read request is the cache miss and a write to the first partition is in progress.

The cache controller may suspend the read request when the read request targets to the first partition in a case where the read request is the cache miss and the write to the first partition is in progress.

The cache controller may instruct the memory controller to read the target data from the second memory module when the read request is the cache hit.

The cache controller may splits an address of a write request into at least a second cache index and a second tag, determine whether the write request is a cache hit or a cache miss by referring to the lookup logic based on the second cache index and the second tag, and check whether an empty cache line exists in the second memory module by referring to the lookup logic when the write request is the cache miss.

When no empty cache line exists, the cache controller may retrieve a victim cache line among the plurality of cache lines by referring to the lookup logic, and instruct the memory controller to read victim data from the victim cache line of the second memory module, to write the victim data to the first memory module, and to write target data of the write request to the victim cache line of the second memory module.

The lookup logic may include a plurality of ways, each way may include a plurality of sets which correspond to the plurality of cache indices, respectively, and each set may include a counter. In this case, the cache controller may select, as the victim cache line, a cache line indicated by a way in which the counter has a predetermined value at a target set corresponding to the second cache index among the plurality of sets.

Each time a cache access occurs in the target set, the lookup logic may set the counter corresponding to a way in which the cache access occurs to zero and increment the counter corresponding to the other way by one. In this case, the predetermined value may be a value obtained by subtracting one from a number of the plurality of ways.

When the empty cache line exists, the cache controller may instruct the memory controller to write the target data of the write request to the empty cache line of the second memory module, and update the lookup logic.

When the write request is the cache hit, the cache controller may instruct the memory controller to write the target data of the write request to the second memory module.

The write in progress may be a write according to a cache eviction.

The write in progress may be a write according to a persistent operation by a cache line flush request and a fence request.

The cache controller may perform a read operation even after the fence request.

According to another embodiment of the present invention, a memory controlling device configured to connect to a first memory module including a resistance switching memory and a second memory module used as a cache is provided. The memory controlling device includes a memory controller that accesses the first memory module and the second memory module, a lookup logic including a plurality of ways, each including a plurality of sets which correspond to a plurality of cache indices, respectively, each set including tag information and a counter, and the plurality of cache indices corresponding to a plurality of cache lines of the second memory module, respectively, and a cache controller. The cache controller splits an address of a write request into at least a first cache index and a first tag, and determines whether the write request is a cache hit or a cache miss by referring to the lookup logic based on the first cache index and the first tag. When the write request is the cache miss and no empty cache line exists in the second memory module, the cache controller selects, as a victim cache line, a cache line indicated by a way in which the counter has a predetermined value at a target set corresponding to the first cache index among the plurality of sets, and instructs the memory controller to write victim data of the victim cache line to the first memory module.

Each time a cache access occurs in the target set, the lookup logic may set the counter corresponding to a way in which the cache access occurs to zero and increment the counter corresponding to the other way by one. In this case, the predetermined value may be a value obtained by subtracting one from a number of the plurality of ways.

The first memory module may include a memory cell array which is partitioned into a plurality of partitions including a first partition and a second partition. The cache controller may split an address of a read request into at least a second cache index and a second tag, determine whether the read request is a cache hit or a cache miss by referring to the lookup logic based on the second cache index and the second tag, and instruct the memory controller to read target data of the read request from the first memory module when the read request targets to the second partition in a case where the read request is the cache miss and a write to the first partition is in progress.

The cache controller may suspend the read request when the read request targets to the first partition in a case where the read request is the cache miss and the write to the first partition is in progress.

The cache controller may instruct the memory controller to read the target data of the read request from the second memory module when the read request is the cache hit.

According to yet another embodiment of the present invention, a memory controlling device configured to connect to a first memory module and a second memory module used as a cache is provided. The first memory module includes a resistance switching memory cell array which are partitioned into a plurality of partitions including a first partition and a second partition. The memory controlling device includes a memory controller that accesses the first memory module and the second memory module, a lookup logic, and a cache controller. The lookup logic includes a plurality of ways and manages tag information of a plurality of cache lines of the second memory module, each way includes a plurality of sets which correspond to the plurality of cache indices, respectively, and the plurality of cache indices correspond to the plurality of cache lines, respectively. The cache controller splits an address of a request into at least a target cache index and a target tag, and determines whether the request is a cache hit or a cache miss by referring to the lookup logic based on the target cache index and the target tag. In a case where the request is the cache miss, the cache controller, when the request is a read request, a write to the first partition is in progress, and the read request targets to the second partition, instructs the memory controller to read target data of the read request from the first memory module. Further, when the request is a write request and no empty cache line exists in the second memory module, the cache controller detects a target way among the plurality of ways in a target set corresponding to the target cache index among the plurality of sets in one clock cycle, selects a cache line of the target way in the target set as a victim cache line, and instructs the memory controller to write victim data of the victim cache line to the first memory module and to write target data of the write request to the victim cache line.

According to still embodiment of the present invention, a memory system including the memory controlling device, the first memory module, and the second memory module is provided.

DETAILED DESCRIPTION OF THE EMBODIMENTS

Figure 1:
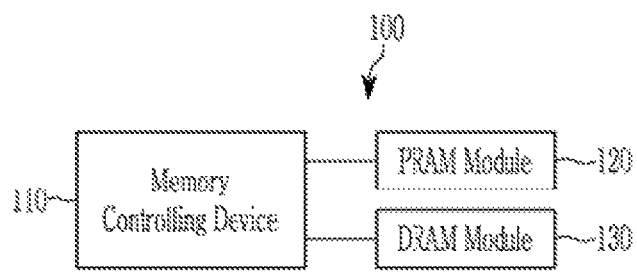
FIG. 1 is schematic block diagram showing a memory system according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

FIG. 1 is schematic block diagram showing a memory system according to an embodiment of the present invention.

Referring to FIG. 1, a memory system 100 according to an embodiment of the present invention includes a memory controlling device 110, a resistance switching memory module 120, and a cache memory module 130.

The memory controlling device 110 receives an input/output (I/O) request from a host, and access the resistance switching memory module 120 and cache memory module 130 based on the received I/O request.

The resistance switching memory module 120 includes, as a non-volatile memory, a phase-change memory (PCM) using a resistivity of a resistance medium (phase-change material), a resistive memory using a resistance of a memory device, or a magnetoresistive memory. While the PCM, in particular, a phase-change random access memory (PRAM) is described as an example of the resistance switching memory in below embodiments, embodiments of the present invention are not limited to the PCM (or PRAM), but may be applicable to the resistive memory, for example, a resistive random access memory (RRAM) or the magnetoresistive memory, for example, a magnetoresistive random access memory (MRAM) such as a spin-transfer torque MRAM (STT-MRAM).

The cache memory module 130 is used as a cache, and may be, for example, a dynamic random access memory (DRAM) module. While the DRAM is described as an example of the cache in below embodiments, embodiments of the present invention are not limited to the DRAM, but may be applicable to the other memory which can be used as the cache.

Next, an example of the PRAM module 120 included in the memory system 100 according to an embodiment of the present invention is described.

Figure 2:
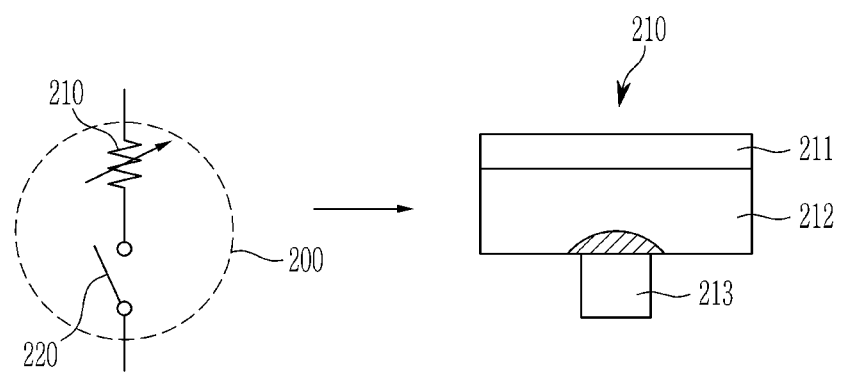
FIG. 2 schematically shows one memory cell in a PRAM.
Figure 3:
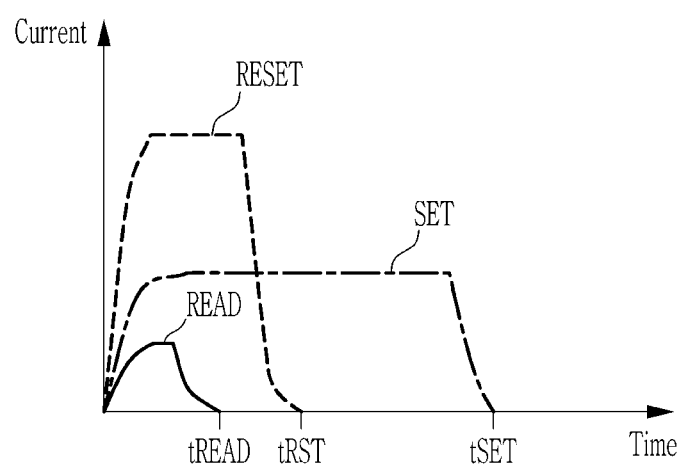
FIG. 3 shows a current applied to a memory cell shown in FIG. 2.
Figure 4:
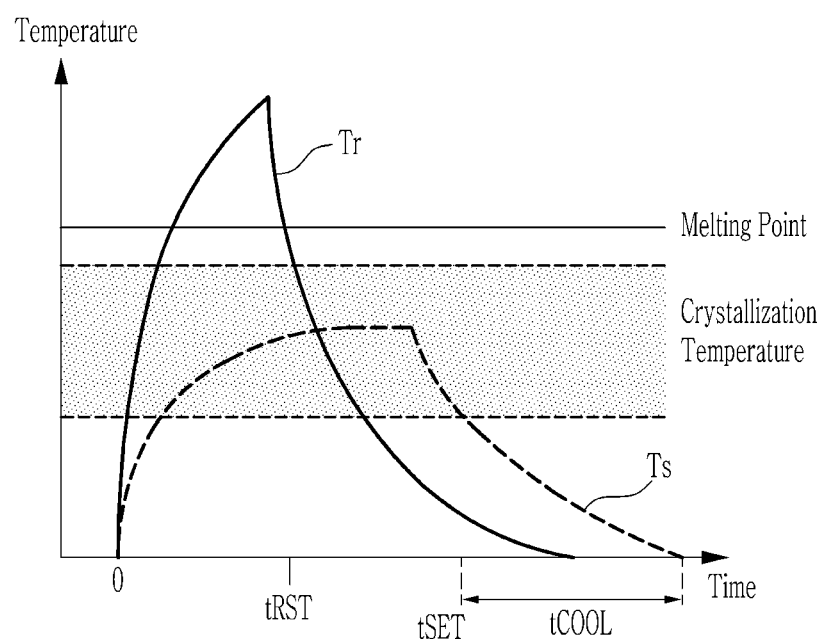
FIG. 4 shows a temperature change when a current shown in FIG. 3 is applied to a memory cell shown in FIG. 2.

FIG. 2 schematically shows one memory cell in a PRAM, FIG. 3 shows a current applied to a memory cell shown in FIG. 2, and FIG. 4 shows a temperature change when a current shown in FIG. 3 is applied to a memory cell shown in FIG. 2.

The memory cell shown in FIG. 2 is an example memory cell, and a memory cell of the PRAM according to embodiments of the present invention may be implemented in various forms.

Referring to FIG. 2, a memory cell 200 of a PRAM includes a phase change element 210 and a switching element 220. The switching element 220 may be implemented with various elements such as a transistor or a diode. The phase change element 210 includes a phase change layer 211, an upper electrode 212 formed above the phase change layer 211, and a lower electrode 213 formed below the phase change layer 211. For example, the phase change layer 210 may include an alloy of germanium (Ge), antimony (Sb) and tellurium (Te), which is referred to commonly as a GST alloy, as a phase change material.

The phase change material can be switched between an amorphous state with relatively high resistivity and a crystalline state with relatively low resistivity. A state of the phase change material may be determined by a heating temperature and a heating time.

Referring to FIG. 2 again, when a current is applied to the memory cell 200, the applied current flows through the lower electrode 213. When the current is applied to the memory cell 200 during a short time, a portion, of the phase change layer 211, adjacent to the lower electrode 213 is heated by the current. The cross-hatched portion of the phase change layer 211 is switched to one of the crystalline state and the amorphous state in accordance with the heating profile of the current. The crystalline state is called a set state and the amorphous state is called a reset state.

Referring to FIG. 3 and FIG. 4, the phase change layer 211 is programed to the reset state when a reset pulse RESET with a high current is applied to the memory cell 200 during a short time tRST. If a temperature Tr of the phase change material reaches a melting point as the phase change material of the phase change layer 211 is heated by the applied reset pulse RESET, the phase change material is melted and then is switched to the amorphous state. The phase change layer 211 is programed to the set state when a set pulse SET having a lower current than the reset pulse RESET is applied to the memory cell 200 during a time tSET being longer than the time tRST. If a temperature Ts of the phase change material reaches a crystallization temperature lower than the melting point as the phase change material is heated by the applied set current SET, the phase change material is transformed to the crystalline state. Since the reset state and the set state can be maintained when a pulse is applied with a lower current than the set pulse SET or during the shorter time than the set pulse SET, data can be programmed to the memory cell 200.

The reset state and the set state may be set to data of "1" and "0," respectively, and the data may be sensed by measuring the resistivity of the phase change element 210 in the memory cell 200. Alternatively, the reset state and the set state may be set to data of "0" and "1," respectively.

Therefore, the data stored in the memory cell 200 can be read by applying a read pulse READ to the memory cell 200. The read pulse READ is applied with a low current during a very short time tREAD such that the state of the memory cell 200 is not changed. The current of the read pulse READ may be lower than the current of the set pulse SET, and the applied time of the read pulse READ may be shorter than the applied time tRST of the reset pulse RESET. Because the resistivity of the phase change element 210 in the memory cell 200 is different according to the state of the phase change element 210, the state of the memory cell 200, i.e., the data stored in the memory cell 200, can be read by a magnitude of a current flowing to the phase change element 210 or a voltage drop on the phase change element 210.

In one embodiment, the state of the memory cell 200 may be read by a voltage at the memory cell 200 when the read pulse READ is applied. In this case, since the phase change element 210 of the memory cell 200 has a relatively high resistance in the reset state, the state may be determined to the reset state in a case that the voltage sensed at the phase change element 210 is relatively high and to the set state in a case that the voltage sensed at the phase change element 210 is relatively low. In another embodiment, the state of the memory cell 200 may be read by an output current when a voltage is applied to the memory cell 200. In this case, the state may be determined to the reset state in a case that the current sensed at the phase change element 210 is relatively low and to the set state in a case that the current sensed at the phase change element 210 is relatively high.

As writing data is practically a sequence of reset and set processes in the PRAM, a write operation is much slower than a read operation by the reset pulse having the longer applied time.

Figure 5:
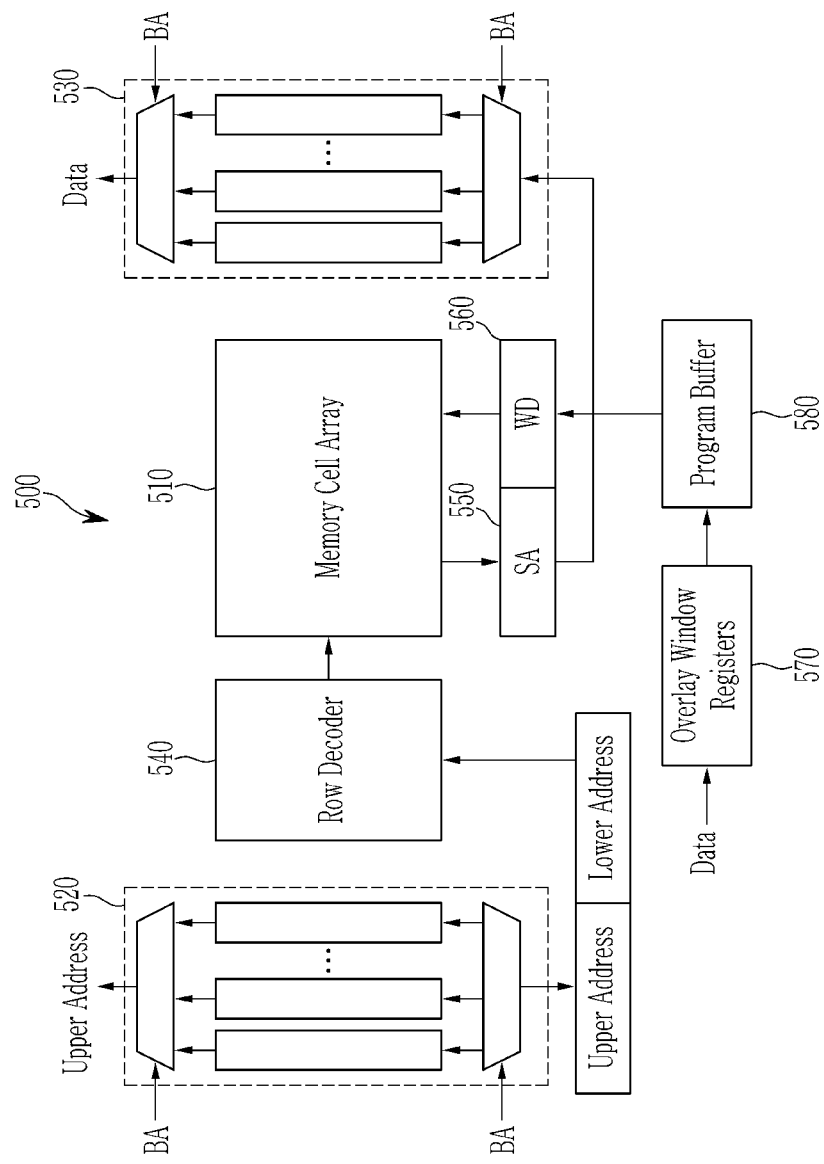
FIG. 5 is a schematic block diagram showing a PRAM module in a memory controlling device according to an embodiment of the present invention.

FIG. 5 is a schematic block diagram showing a PRAM module in a memory controlling device according to an embodiment of the present invention. A PRAM module shown in FIG. 5 may be a PRAM chip or a PRAM bank.

Referring to FIG. 5, a PRAM module 500 includes a memory cell array 510, a row address buffer 520, a row data buffer 530, a row decoder 540, a sense amplifier 550, and a write driver 560.

The memory cell array 510 includes a plurality of word lines (not shown) extending substantially in a row direction, a plurality of bit lines (not shown) extending substantially in a column direction, and a plurality of memory cells (not shown) that are connected to the word lines and the bit lines and are formed in a substantially matrix format. The memory cell may be, for example, a memory cell 200 described with reference to FIG. 2.

Both the row address buffer 520 and the row data buffer 530 form a row buffer. Each row buffer is logically paired by the row address buffer 520 and the row data buffer 530, and is selected by a buffer address.

The row address buffer 520 stores commands and addresses (particularly, row addresses) from a memory controller (not shown). The row data buffer 530 stores data from the memory cell array 510.

In some embodiments, the PRAM module 500 may employ a non-volatile memory (NVM) interface to use the plurality of row buffers 520 and 530. In one embodiment, the non-volatile memory interface may be a double data rate (DDR) interface, for example, LPDDR2-NVM (low-power double data rate 2 non-volatile memory) interface. The row address buffer 520 receives a row address and a bank address via the NVM interface, and the row data buffer 530 outputs data via the NVM interface.

The row decoder 540 decodes a row address to select a target row from among the plurality of rows in the memory cell array 510. That is, the row decoder 540 selects a target word line for reading data or writing data from among the plurality of word lines of the memory cell array 510.

In some embodiments, the row address transferred from the memory controller may be divided into an upper address and a lower address. In this case, the upper address may be delivered to the row address buffer 520, and the lower address may be directly delivered to the row decoder 540. The row decoder 540 may combine the upper address accommodated in the row address buffer 520 with the directly delivered lower address to select the target row.

The sense amplifier 550 reads data stored in the memory cell array 510. The sense amplifier 550 may read the data, through a plurality of bit lines, from a plurality of memory cells connected to the word line selected by the row decoder 540. The write driver 560 writes the input data to the memory cell array 510. The write driver 560 may write the data, through a plurality of bit lines, to a plurality of memory cells connected to the word line selected by the row decoder 540.

In some embodiments, to address the issue that the write operation is slower than the read operation, the PRAM module 500 may first store the input data to a buffer and then write the stored data to the memory cell array 510. For this, the PRAM module 500 may include an overlay window 570 and 580 as memory-mapped registers. The overlay window may include overlay window registers 570 and a program buffer 580. In one embodiment, information on write data (for example, the first data address and the number of bytes to be programmed) may be written to the registers 570 and then the write data may be stored to the program buffer 580. Next, when a predetermined value is written to the overlay window registers 570, the data stored to the program buffer 580 may be written to the memory cell array 510. In this case, the memory controller may determine whether the write operation is completed by polling the overlay window registers 570.

Figure 6:
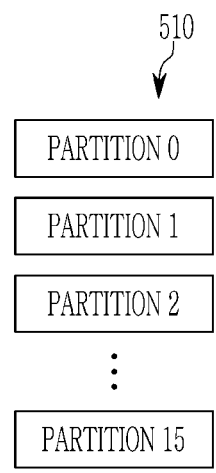
FIG. 6 shows an example of a partitioning scheme in a memory cell array of a PRAM module according to an embodiment of the present invention.
Figure 7:
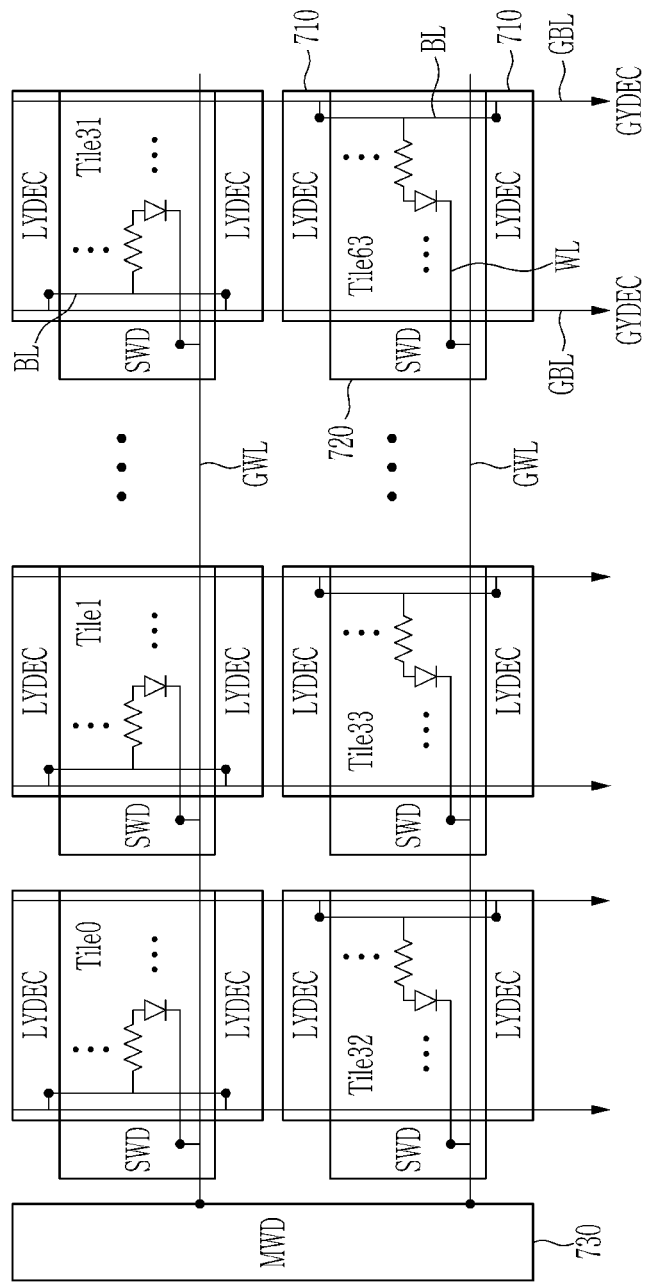
FIG. 7 shows an example of a partition in a PRAM module according to an embodiment of the present invention.

FIG. 6 shows an example of a partitioning scheme in a memory cell array of a PRAM module according to an embodiment of the present invention, and FIG. 7 shows an example of a partition in a PRAM module according to an embodiment of the present invention.

Referring to FIG. 6, in some embodiments, a memory cell array 510, for example, a PRAM bank may be partitioned into a plurality of partitions PART0 to PART15. It is shown in FIG. 6 that the memory cell array 510 is partitioned into sixteen partitions PART0 to PART15. A plurality of row buffers 520 and 530 may be connected to the partitions PART0 to PART15. For example, each partition may perform 128-bit parallel I/O processing.

Referring to FIG. 7, in some embodiments, each partition may include a plurality of sub-arrays which are referred to as resistive tiles. It is shown in FIG. 7 that one partition includes 64 tiles Tile0 to Tile63.

Each tile includes a plurality of memory cells, i.e., PRAM cores connected to a plurality of bit lines (e.g., 2048 bit lines) and a plurality of word lines (e.g., 4096 word lines). For convenience, one memory cell among the plurality of memory cells, and one bit line BL and one word line WL connected to the one memory cell are shown in FIG. 7. Further, a phase change element and a switching element forming the memory cell are shown as a resister and a diode, respectively.

A local column decoder (hereinafter referred to as an "LYDEC") 710 may be connected to each tile. The LYDEC 710 is connected to the plurality of bit lines BL of a corresponding tile. Further, a plurality of global bit lines GBL, which correspond to the plurality of tiles respectively, may be formed in the partition. Each global bit line GBL may be connected to the plurality of bit lines BL of the corresponding tile and to a global column decoder (hereinafter referred to as a "GYDEC"). In some embodiments, the LYDEC 710 together with the GYDEC may be used to select bit lines BL in the corresponding tile of the corresponding partition. A sense amplifier (550 of FIG. 5) may read data through the selected bit lines BL or a write driver (570 of FIG. 5) may write data through the selected bit lines BL.

A sub-word line driver (hereinafter referred to as an "SWD") 720 may be connected to each tile to maximize the degree of parallelism. A global word line GWL may be formed in the partition and may be connected to a main word line driver (hereinafter referred to as an "MWD") 730. In this case, a plurality of word lines WL formed in the partition may be connected to the global word line GWL. All the SWDs within the partition are connected to the MWD 730. In some embodiments, the SWD 720 together with the MWD 730 may be used to drive a word line WL in the corresponding tile. The driven word line WL may be selected by a row decoder (540 of FIG. 5).

When the partition structure shown in FIG. 6 and FIG. 7 is used, a plurality I/O operations (e.g., 64 I/O operations in an example of FIG. 7) per partition can be simultaneously performed. Further, since the local decoder and the word line driver in each partition as shown in FIG. 6 and FIG. 7, the memory system can access different partitions in parallel. However, the different partitions can support simultaneous I/O services only if the type of incoming I/O requests is different. For example, a read and a write can be served in parallel from two different partitions.

Next, a memory controlling device according to an embodiment of the present invention is described with reference to FIG. 8 and FIG. 9.

Figure 8:
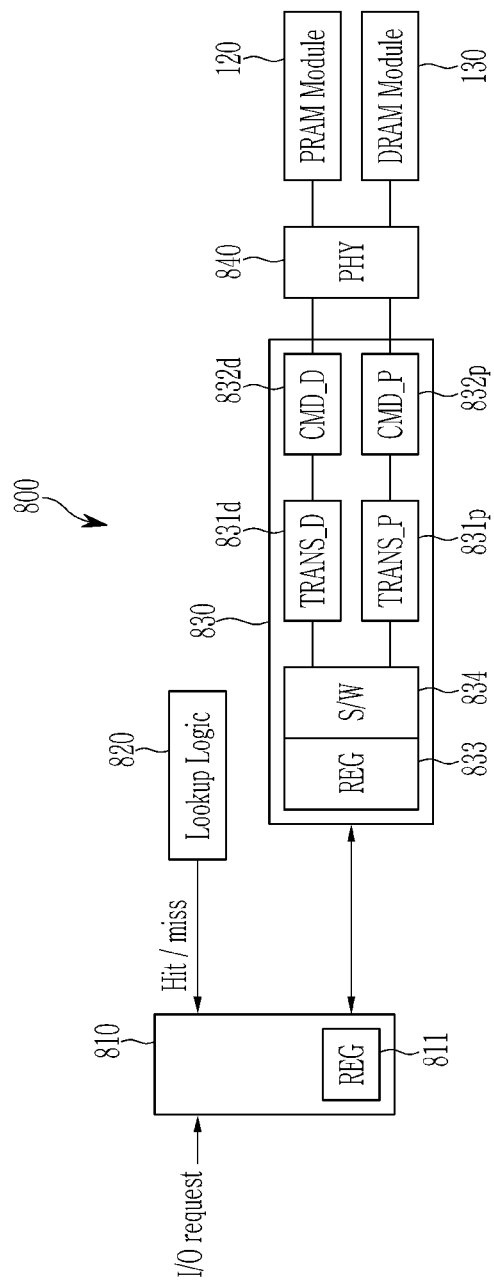
FIG. 8 is schematic block diagram showing a memory controlling device according to an embodiment of the present invention.
Figure 9:
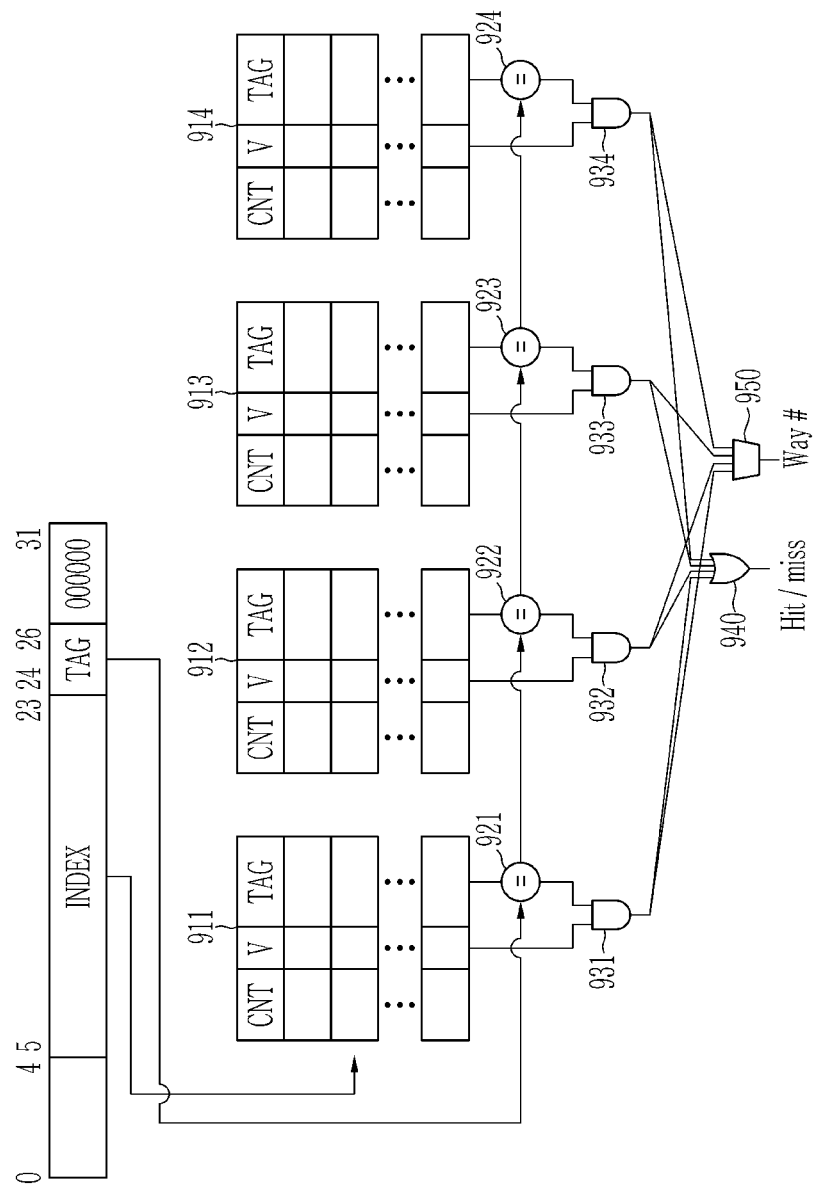
FIG. 9 a diagram schematically showing a lookup logic of a memory controlling device according to an embodiment of the present invention.

FIG. 8 is schematic block diagram showing a memory controlling device according to an embodiment of the present invention, and FIG. 9 a diagram schematically showing a lookup logic of a memory controlling device according to an embodiment of the present invention.

Referring to FIG. 8, a memory controlling device 800 includes a cache controller 810, a lookup logic 820, and a memory controller 830.

The cache controller 810 receives an I/O request from a host. The I/O request includes an operation type and an address. The operation type indicates a read or a write, and the I/O request further includes write data when the operation type indicates the write. In some embodiments, the operation type may indicate an erase. The cache controller 810 checks whether target data are in a cache, i.e., a DRAM module 130 using the lookup logic 820. The lookup logic 820 indicates a cache hit or a cache miss for the I/O request.

The cache controller 810 may further include a set of registers 811. The registers 811 may include a register for indicating a ready status (i.e., a busy status or an idle status) of the memory controller 830 and a register related to read data delivered from the memory controller 830. The cache controller 810 exposes the registers 811 to the memory controller 830 for communication with the memory controller 830.

The memory controller 830 includes a transaction module 831 and a command module 832. The transaction module 831 includes a DRAM transaction module 831d and a PRAM transaction module 831p, and the command module includes a DRAM command module 832d and a PRAM command module 832p. The memory controller 830 further includes a set of registers 833 related to basic I/O operations and a switch 834 that indicates which memory module will be used, and exposes the registers 833 and the switch 834 to cache controller 810 for communication with the cache controller 810. The registers 833 may store an operation type related to the basic I/O operation, an address, and write data. The switch 834 forwards the I/O request to a corresponding transaction module among the DRAM transaction module 831d and the PRAM transaction module 831p in accordance with an indication of the cache controller 810.

The transaction modules 831d and 831p are provided for I/O operations for heterogeneous memory interface, i.e., a DRAM module 130 and a PRAM module 120. The DRAM transaction module 831d forwards an incoming I/O request to the DRAM command module 832d, and the DRAM command module 832d sends row and column addresses to the DRAM module 130 through a read/write command. Accordingly, the memory controller 830 can access the DRAM module 130. In other words, the memory controller 830 can read data from the DRAM module 130 in a case of the read command, and can write data to the DRAM module 130 in a case of the write command. The PRAM transaction module 831p generates a request for the PRAM module 120 from the I/O request, and forwards the generated command to the PRAM command module 832p. The PRAM command module 832d sends row and column addresses to the PRAM module 120 through a read/write command in accordance with the request forwarded from the PRAM transaction module 831p. Accordingly, the memory controller 830 can access the PRAM module 120.

In some embodiments, the transaction modules 831d and 831p can access to the PRAM module 120 and the DRAM module 130 through a physical layer 840. The physical layer 840 may manage timing of commands issued to the PRAM module 120 and the DRAM module 130.

In some embodiments, as described with reference to FIG. 5, when the PRAM module 120 uses an overlay window 570 and 580, the PRAM transaction module 831p may generate a command code/address, data, and a command execution for the overlay window 570 and 580 from a write request.

In some embodiments, the DRAM command module 832d may issue the row address the DRAM module 130 through an active command and issue the column address to the DRAM module 130 through the read/write command, based on the request received from the DRAM transaction module 831d. The DRAM module 130 can read or write data according to the row and column addresses, i.e., a memory address.

In some embodiments, the PRAM command module 832p may perform three-phase addressing based on the request received from the PRAM transaction module 831p. In this case, at the first phase of the three-phase addressing, i.e., a preactive phase, the PRAM command module 832p may issue an upper row address of the row address to the PRAM module 120 through a preactive command. At the second phase, i.e., an active phase, the PRAM command module 832p may issue a remaining address (i.e., a lower row address) to the PRAM module 120. Accordingly, the actual row address can be composed in the PRAM module 120. Next, the PRAM command module 832p may issue the column address to the PRAM module 120 through a read/write command. The PRAM module 120 can read or write data according to the composed row address and the column address.

Referring to FIG. 9, a lookup logic 820 includes a plurality of ways, for example, four ways 911, 912, 913, and 914. Each way include a plurality of sets corresponding to cache indices, and each set may indicate a cache line in a cache. The cache line may be a predetermined size of DRAM block, for example, a 32-byte DRAM block. In some embodiments, each of the ways 911 to 914 may be a block memory, for example, an FPGA (field programmable gate array) built-in BRAM (block random access memory). In some embodiments, each of the ways 911 to 914 may be a byte-addressable block memory.

An incoming I/O request for the memory controlling device may split into at least a tag and a cache index. Sizes of the tag and cache index may be determined by a size of the cache. For example, when 512K cache indices and four ways are used, an address (e.g., a 32-bit address) of the I/O request may be split into a 19-bit cache index (5-23) and 3-bit tag (24-26) besides an offset (e.g., 5 bits 0-4). In this example, each way has 512K sets to correspond to the 19-bit cache index, i.e., 512K cache indices. Each set includes a tag array TAG, a counter CNT, and a valid bit V. The tag array TAG stores the tag of the address of the I/O request, and the valid bit V indicates whether data exist in a corresponding cache line. For example, the valid bit V may be set to '1' if the data are exist, and the valid bit V may be set to '0' if the data do not exist. In this example, an entry size of the tag array TAG is three bits. Further, the counter CNT and valid bit V may have two bits and one bit, respectively. Accordingly, in this example, each set may have one byte, and each way may use a 512 KB memory, for example, a 512 KB BRAM.

The lookup logic 820 may further include a plurality of comparators 921, 922, 923, and 924 which correspond to the plurality of ways 911 to 914, respectively, a plurality of AND gates 931, 932, 933, and 934 which correspond to the plurality of ways 911 to 914, respectively, an OR gate 940, and a multiplexer 950. Each of comparators 921 to 924 compares an output of the tag array TAG in a corresponding one of the ways 911 to 914 with the tag of the incoming I/O request, and outputs either '1' or '0' according to the comparison result. For example, each of the comparators 921 to 924 may output '1' if the output of the tag array TAG is equal to the tag of the incoming I/O request, and may output '0' otherwise. Each of the AND gates 931 to 934 performs an AND operation between an output of a corresponding one of the comparators 921 to 924 and an output of a valid bit V in a corresponding one of the ways 911 to 914. In other words, each of the AND gates 931 to 934 may output '1', i.e., a cache hit if the output of the tag array TAG is equal to the tag of the incoming I/O request and the valid bit V is set to '1'. The OR gate 940 finally outputs either the cache hit or the cache miss from the outputs of the AND gates 931 to 934. The OR gate 940 may output '1', i.e., the hit if any one of the AND gates 931 to 934 outputs '1', and may output '0', i.e., miss if all of the AND gates 931 to 934 output '0'. The multiplexer 950 may output a number of a way corresponding to the hit among the ways 911 to 914, i.e., the number of the way corresponding to the AND gate outputting '1'

Next, an I/O operation of a memory system according to an embodiment of the present invention is described with reference to FIG. 10 to FIG. 13.

Figure 10:
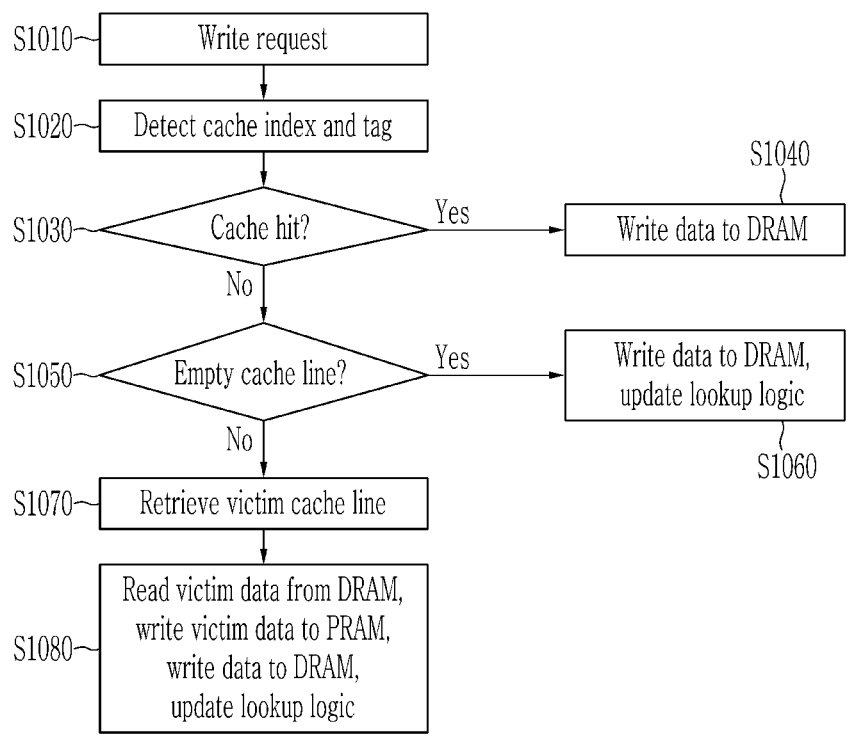
FIG. 10 is a flowchart schematically showing a write operation in memory system according to an embodiment of the present invention.
Figure 11:
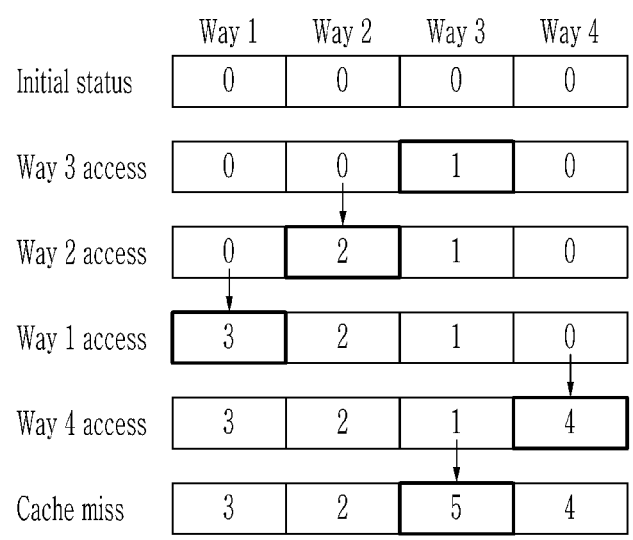
FIG. 11 and FIG. 12 show cache replacement in a memory system according to an embodiment of the present invention.
Figure 12:
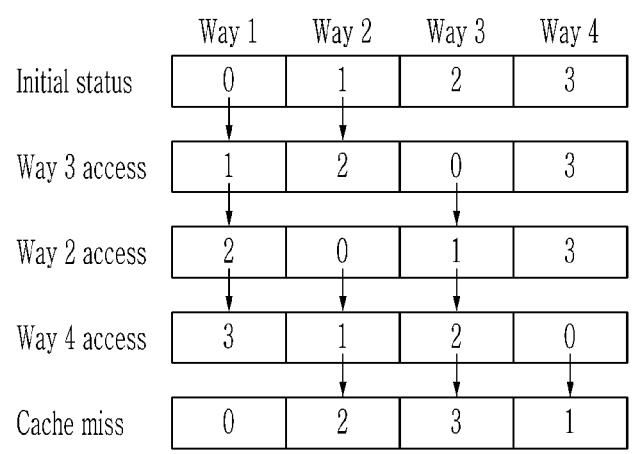

FIG. 10 is a flowchart schematically showing a write operation in memory system according to an embodiment of the present invention, and FIG. 11 and FIG. 12 show cache replacement in a memory system according to an embodiment of the present invention.

Referring to FIG. 10, upon receiving a write request in step S1010, a cache controller (810 of FIG. 8) detects a cache index and a tag from an address of the write request in step S1020. In step S1030, a lookup logic (820 of FIG. 8 and FIG. 9) outputs whether the write request hits in a cache based on the cache index and the tag.

In some embodiments, a tag and a valid bit may be detected in a set corresponding to the cache index in each way (911 to 914 of FIG. 9) of the lookup logic 820, based on the cache index of the write request. Then, each of comparators (921 to 924 of FIG. 9) corresponding to the ways 911 to 914 compares the detected tag with the tag of the write request, and a comparison result of each of the comparators 921 to 924 and the valid tag may be forwarded to a corresponding one of AND gates 931 to 934. Each of the AND gates 931 to 934 may output a cache hit, i.e., '1' when the two tags are the same as the comparison result and the valid bit is '1' in the corresponding way. Each of the AND gates 931 to 934 may output a cache miss, i.e., '0' when the two tags are different as the comparison result or the valid bit is '0' in the corresponding way. An OR gate 940 may output the cache hit or the cache miss according to outputs of the AND gates 931 to 934, and the multiplexer 950 may output a number of the way corresponding to the cache hit.

In a case of the cache hit (S1030), in step S1040, the cache controller 810 instructs a memory controller 830 to write data to a cache line indicated by the way corresponding to the cache hit, i.e., a DRAM module. In other words, the cache controller 810 may compose a write request for a DRAM transaction module 831*d* of the memory controller 830 and deliver the write request to the memory controller 830.

In a case of the cache miss (S1040), in step S1050, the cache controller 810 checks whether an empty cache line exists. In other words, in step S1050, the cache controller 810 determines whether an empty cache line exists among a plurality of cache lines indicated by a plurality of sets corresponding to the cache index of the write request in a plurality of ways 911 to 914. When the empty cache line exists, the cache controller 810 instructs the memory controller 830 to write data to the empty cache line and updates the lookup logic 820 in step S1060. In other words, the cache controller 810 may compose a write request for a DRAM transaction module 831*d* of the memory controller 830 and deliver the write request to the memory controller 830. In this case, the cache controller 810 may update information of the set corresponding to the cache index in the lookup logic 820. For example, the cache controller may set a tag of the set corresponding to the empty cache line to the tag of the write request and set the valid bit to '1' in step S1060. In some embodiments, in step S1060, the cache controller 810 may update a counter CNT of the corresponding set for cache replacement.

When there is no empty cache line (S1050), the lookup logic 820 retrieves a victim cache line for the cache replacement in step S1070. In some embodiments, the lookup logic 820 may check counters CNT of the corresponding sets in the ways 911 to 914 and retrieve a cache line storing the oldest data as the victim cache line. In step S1080, the cache controller 810 instructs the memory controller 830 to read victim data from the victim cache line and write the victim data to a PRAM module, and to write data of the write request to the victim cache line. In other words, cache controller 810 may read victim data from the victim cache line through the DRAM transaction module 831*d* of the memory controller 830, and write the victim data to the PRAM module through PRAM transaction module 831*d*. Further, the cache controller 810 may write data of the write request to the victim cache line through the DRAM transaction module 831*d* of the memory controller 830. In this case, the cache controller 810 may update information of the set corresponding to the cache index in the lookup logic 820. For example, in step S1080, the cache controller 810 may set a tag of a set corresponding to the victim cache line to the tag of the write request and set a valid bit to '1' in the lookup logic 820. In some embodiments, the cache controller 810 may update the counter CNT of the corresponding set in step S1080.

In some embodiments, the lookup logic 820 may use LRU (least recently used) replacement for the cache replacement.

In one embodiment, the lookup logic 820 may further include a global counter. FIG. 11 shows counters of a plurality for ways (four ways) in a predetermined set. As shown in FIG. 11, the counter of each way is set to an initial value ('0'). The lookup logic 820 may increase a counter value of the global counter each time a cache access occurs, and update the counter of the way in which the cache access occurs with the counter value of the global counter. In an example shown in FIG. 11, the cache access occurs in the order of way 3, way 2, way 1, and way 4 so that the counters of way 3, way 2, way 1, and way 4 are set to '1', '2', '3', and '4', respectively. In this case, if a cache miss occurs in the predetermined set, the lookup logic 820 retrieves a victim cache line for cache replacement. Since data stored in a cache line corresponding to the way (way 3) having the smallest counter value are the oldest data, the lookup logic 820 may replace the data of that way (way 3). Further, since the cache access has occurred in way 3, the counter of way 3 may be set to '5'.

In this case, the lookup logic 820 performs comparisons three times to retrieve the way having the smallest counter value since the four ways are used. In other words, at least three clock cycles are required for the lookup logic 820 to find the way having the smallest counter value. Furthermore, the lookup logic 820 should maintain the global counter per set to manage the counter values, the size of the global counter should be large enough to continuously increment the counter value, and many bits should be allocated to the counter of each set.

In another embodiment, as shown in FIG. 12, counters of a plurality of ways in a predetermined set may be set to different initial values. For example, the counters of way 1, way 2, way 3, and way 4 may be set to '0', '1', '2', and '3', respectively. In this case, each a cache access occurs, a lookup logic 820 may increment the counter of the way having the smaller counter value than the way in which the cache access occurs by 1, and set the counter value of the way in which the cache access occurs to '0'. Referring to an example shown in FIG. 12, when the cache access occurs in way 3, the lookup logic 820 may increment the counters of way 1 and way 2 by 1 to set the counters of way 1 and way 2 to '1' and '2', respectively, and set the counter of way 3 to '0'. Subsequently, when the cache access occurs in way 2, the lookup logic 820 may increment the counters of way 1 and way 3 by 1 to set the counters of way 1 and way 3 to '2' and '1', respectively, and set the counter of way 2 to '0'. Subsequently, when the cache access occurs in way 4, the lookup logic 820 may increment the counters of way 1, way 2, and way 3 by 1 to set the counters of way 1, way 2, and way 3 to '3', '1', and '2', respectively, and set the counter of way 4 to '0'. Subsequently, when a cache miss occurs in the predetermined set, the lookup logic 820 retrieves a victim cache line for cache replacement. In this case, since data stored in a cache line corresponding to way 1 having the largest counter value, i.e., '3' are the oldest data, the lookup logic 820 may replace the data of way 1. Further, since the cache access occurs in way 1, the counters of way 2, way 3, and way 4 may be incremented by 1 to be set to '2', '3', and '1', respectively, and the counter of way 1 may be set to '0'.

As such, according to the embodiment described with reference to FIG. 12, the lookup logic 820 can return the victim cache line in one clock cycle because it retrieves the way having a predetermined counter value, for example, 3 (i.e., a value obtained by subtracting 1 from the number of ways) without comparing the counter values among the ways. Further, since the counter of each set has the number of bits corresponding to the number of ways (e.g., 2 bits in four ways), the entry size of each set can be decreased and the global counter can be omitted. Furthermore, the clock cycles used to update the counter can be invisible to a host as they are overlapped with the operation latency in the DRAM module or PRAM module.

As described above, according to an embodiment of the present invention, the victim cache line can be searched within the short time (e.g., in one clock cycle) when the cache miss occurs.

Figure 13:
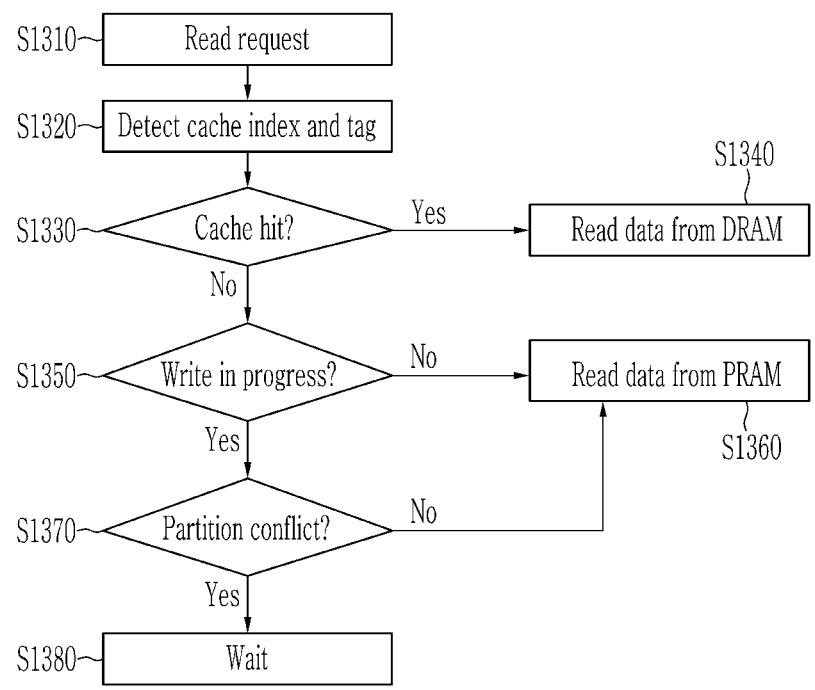
FIG. 13 is flowchart schematically showing a read operation in a memory system according to an embodiment of the present invention.

FIG. 13 is flowchart schematically showing a read operation in a memory system according to an embodiment of the present invention.

Referring to FIG. 13, upon receiving a read request in step S1310, a cache controller (810 of FIG. 8) detects a cache index and a tag from an address of the read request in step S1320. In step S1330, a lookup logic (820 of FIG. 8 and FIG. 9) outputs whether the read request hits in a cache based on the cache index and the tag.

In some embodiments, a tag and a valid bit may be detected in a set corresponding to the cache index in each way (911 to 914 of FIG. 9) of the lookup logic 820, based on the cache index of the read request. Then, each of comparators (921 to 924 of FIG. 9) corresponding to the ways 911 to 914 compares the detected tag with the tag of the read request, and a comparison result of each of the comparators 921 to 924 and the valid tag may be forwarded to a corresponding one of AND gates 931 to 934. Each of the AND gates 931 to 934 may output a cache hit, i.e., '1' when the two tags are the same as the comparison result and the valid bit is '1' in the corresponding way. Each of the AND gates 931 to 934 may output a cache miss, i.e., '0' when the two tags are different as the comparison result or the valid bit is '0' in the corresponding way. An OR gate 940 may output the cache hit or the cache miss according to outputs of the AND gates 931 to 934, and the multiplexer 950 may output a number of the way corresponding to the cache hit.

In a case of the cache hit (S1330), in step S1340, the cache controller 810 instructs a memory controller 830 to read data from a cache line indicated by the way corresponding to the cache hit. In other words, the cache controller 810 may compose a read request for a DRAM transaction module 831*d* of the memory controller 830 and deliver the write request to the memory controller 830.

In a case of the cache miss (S1040), in step S1050, the cache controller 810 checks whether there is a write in progress on a PRAM module. In other words, the cache controller 810 checks whether a cache eviction or persistent operation, which writes data stored in the cache to the PRAM module, is in progress (S1350). When there is no write in progress, the cache controller 810 reads data from the PRAM module through the PRAM transaction module 831*p* of the memory controller 830 in step S1360. For example, the memory controller 830 may compose a read request for PRAM transaction module 831*p* and deliver the read request to the memory controller 830. Accordingly, the memory controller 830 can read data of the read request from the PRAM module.

When there is a write in progress, in step S1370, the cache controller 810 determines whether a partition corresponding to the write in progress conflicts with a partition to which the read request targets. For this, the cache controller 810 may a memory address related to the latest write. In some embodiments, the cache controller 810 may compare upper N bits of a memory address related to the write in progress with upper N bits of a memory address related to the read request. For example, when the PRAM module uses sixteen partitions, a partition number can be identified by upper 4 bits of a memory address. Therefore, the cache controller 810 may compare upper 4 bits of a memory address related to the write in progress with upper 4 bits of a memory address related to the read request. In a case where the partition corresponding to the write in progress is different from the partition corresponding to the read request, the read request can be served without conflicting with the write in progress. Therefore, the cache controller 810 reads data from the PRAM module through the PRAM transaction module 831*p* of the memory controller 830 (S1360). For example, the cache controller 810 may compose a read request for PRAM transaction module 831*p* and deliver the read request to the memory controller 830 (S1360). Accordingly, the memory controller 830 can read data of the read request from the PRAM module.

In a case where the cache eviction is in progress and the write in progress conflicts with the read request, in step S1380, the cache controller may suspend the read request until the write in progress is completed.

In some embodiments, the cache controller 810 may perform a persistent operation in accordance with a fence request and a cache line flush request received from the host. Upon receiving the cache line flush request, the cache controller 810 checks the lookup logic 820 and writes the write data to the PRAM module. The persistent operation may be performed by internally converting the request to an eviction operation in the memory controlling device 800. In one embodiment, the cache line flush request may be issued with an address, and the cache controller 810 may write the write data corresponding to the address of the cache line flush request to the PRAM module. In one embodiment, the fence request may be issued with the cache line flush request. Upon receiving the fence request, the cache controller 810 may serialize the order of writes. In one embodiment, if a read request is received after the fence request, the read request may be served through the unconflicted partition. Thus, the host can process data through the unconflicted partition without a stall even after the cache line flush request. In one embodiment, an I/O service may be suspended if a write request is received after the cache line flush request.

Next, an embodiment using a cache line flush request and a fence request is described with reference to FIG. 14.

Figure 14:
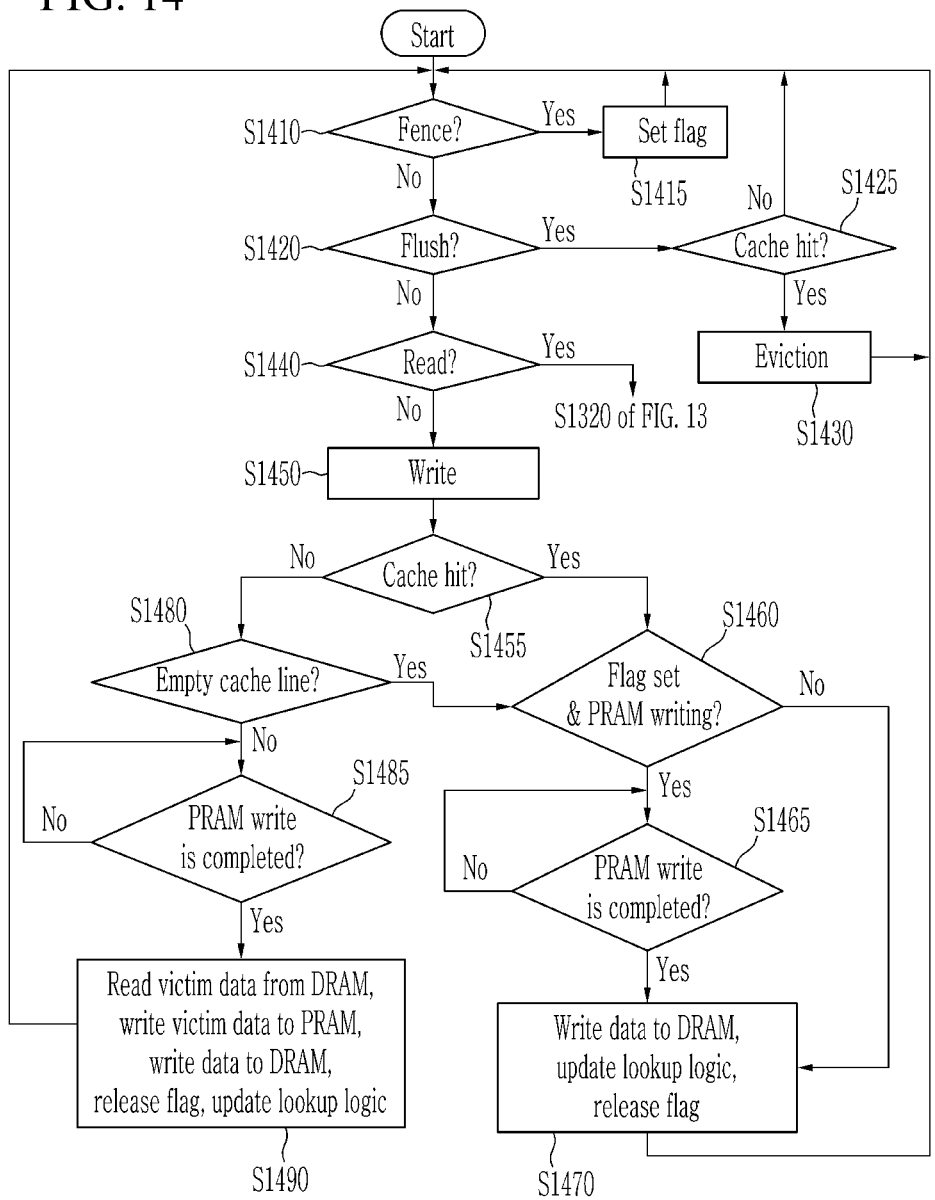
FIG. 14 is a flowchart schematically showing a persistent operation in a memory system according to an embodiment of the present invention.

FIG. 14 is a flowchart schematically showing a persistent operation in a memory system according to an embodiment of the present invention.

Referring to FIG. 14, upon receiving a fence request in step S1410, a cache controller (810 of FIG. 8) set a flag in step S1415. Upon receiving a cache line flush request in step S1420, the cache controller 810 determines whether the flush request hits in a cache based on an address of the flush request in step S1425. In some embodiments, the cache controller 810 may detect a cache index and a tag from the address of the flush request, and a lookup logic (820 of FIG. 8 and FIG. 9) may output whether the flush request hits in the cache based on the cache index and the tag. In a case of a cache hit, the cache controller 810 performs a cache eviction in S1430.

Upon receiving a read request in step S1440, the cache controller 810 performs a read operation as described with reference to steps S1320 to S1380 of FIG. 13.

In one embodiment, upon receiving a write request in step S1450, the cache controller 810 may perform a write operation as described with reference to steps S1020 to S1080 of FIG. 10.

In another embodiment, upon receiving a write request in step S1450, the cache controller 810 determines whether the write request hits in the cache in step S1455. In some embodiments, the cache controller 810 may detect a cache index and a tag from the address of the write request, and the lookup logic 820 may output whether the write request hits in the cache based on the cache index and the tag.

In a case of a cache hit (S1455), in step S1460, the cache controller 810 determines whether the flag is set and a write to a PRAM module is in progress. If the flag is set and the write to the PRAM module is in progress (that is, an eviction is in progress according to the fence request and the flush request) in step S1460, the cache controller 810 waits in step S1465 until the write to the PRAM module is completed. If the write to the PRAM module is completed, in step S1470, the cache controller 810 instructs the memory controller 830 to write data to a cache line indicated by a way corresponding to the cache hit, i.e., a DRAM module. In some embodiments, the cache controller 810 may update cache information. If the flag is not set or no write to the PRAM module is in progress (S1460), the cache controller instructs the memory controller 830 to write data to the DRAM module in step S1470.

In a case of a cache miss (S1455), the cache controller 810 checks whether there is an empty cache line in step S1480. If there is the empty cache line (S1480), an operation after step S1460 may be performed. If there is no empty cache line (S1480), in step S1485, the cache controller 810 determines whether a write to the PRAM module is in progress. If the write to the PRAM module is in progress (S1485), the cache controller 810 waits until the write to the PRAM module is completed. If the write to the PRAM module is completed, in step S1490, the cache controller 810 reads data of the victim cache line and write the data to the PRAM module. Further, the cache controller 810 instructs the memory controller 830 to write data of the write request to the victim cache line and releases the flag. Furthermore, the cache controller 810 may update the lookup logic 820 in step S1490.

Conventionally, in a case where both the flush request and the fence request are used, when the fence request is received, the host should stall until an operation according to the previous flush request is completed. However, according to an embodiment of the present invention, an operation according to the flush request is performed in background, and is turned into a foreground task when the flag is set by the fence request. Accordingly, the read request can be served in the unconflicted partition before a write request is received after the fence request.

As described above, according to an embodiment of the present invention, since the write is first served in the cache instead of the PRAM module having the long write latency, the long write latency of the PRAM module can be hidden. Further, since the read can be served in the unconflicted partition even when there is the write in progress for the cache eviction or persistent operation, a lot of read requests can be processed in parallel during the write latency.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A memory controlling device configured to connect to a first memory module and a second memory module used as a cache including a plurality of cache lines, the memory controlling device comprising:
    a first controlling module that accesses the first memory module and the second memory module, wherein the first memory module includes a resistance switching memory cell array which is partitioned into a plurality of partitions including a first partition and a second partition, and the second memory module is used as a cache including a plurality of cache lines; and
    a second controlling module that:
        determines whether a cache hit or a cache miss occurs for an incoming request; and
        in a case where the cache miss occurs for the incoming request and the incoming request is a read request, determines whether there is a conflict for the first partition to which the read request targets, instructs the first controlling module to read target data of the read request from the first memory module when a write to the second partition different from the first partition is in progress, and suspends the read request when a write to the first partition is in progress.

2. The memory controlling device of claim 1, wherein the second controlling module instructs the first controlling module to read the target data from the second memory module when the cache hit occurs for the read request.

3. The memory controlling device of claim 1, wherein in a case where the cache miss occurs for the incoming request and the incoming request is a write request, the second controlling module determines whether an empty cache line exists among the plurality of cache lines.

4. The memory controlling device of claim 3, wherein the second controlling module determines whether the empty cache line exists among the plurality of cache lines, without determining whether there is a conflict for a partition to which the write request targets.

5. The memory controlling device of claim 3, wherein when the empty cache line exists, the second controlling module instructs the first controlling module to write the target data of the write request to the empty cache line.

6. The memory controlling device of claim 3, wherein when no empty cache line exists, the second controlling module:
    retrieves a victim cache line among the plurality of cache lines;

determines whether a write to the first memory module is in progress; and when no write to the first memory module is in progress, instructs the first controlling module to read victim data from the victim cache line, to write the victim data to the first memory module, and to write target data of the write request to the victim cache line.

7. The memory controlling device of claim 6, wherein when the write to the memory module is in progress, the second controlling module suspends the write request.

8. The memory controlling device of claim 1, wherein in a case where the cache hit occurs for the incoming request and the incoming request is a write request, the second controlling module writes target data of the write request to a corresponding cache line among the plurality of cache lines.

9. A memory apparatus comprising:
the memory controlling device of claim 1;
the first memory module; and
the second memory module.

10. The memory controlling device of claim 1, wherein the first memory module includes a phase change memory.

11. The memory controlling device of claim 10, wherein the second memory module includes a dynamic random access memory.

12. A memory controlling device configured to connect to a first memory module and a second memory module, the memory controlling device comprising:
a first controlling module that accesses the first memory module and the second memory module, wherein the first memory module includes a resistance switching memory cell array which is partitioned into a plurality of partitions including a first partition and a second partition, and the second memory module is used as a cache including a plurality of cache lines; and
a second controlling module that, in a case where an incoming request is a read request, determines whether there is a conflict for the first partition to which the read request targets, instructs the first controlling module to read target data of the read request from the first memory module when a write, of victim data from a victim cache line, to the second partition different from the first partition is in progress, and suspends the read request when a write, of victim data from a victim cache line, to the first partition is in progress.

13. The memory controlling device of claim 12, wherein the first memory module includes a phase change memory.

14. The memory controlling device of claim 13, wherein the second memory module includes a dynamic random access memory.

* * * * *